United States Patent
Choi et al.

(10) Patent No.: US 12,293,933 B2
(45) Date of Patent: May 6, 2025

(54) ELECTROSTATIC CHUCK WITH MULTIPLE HEATER ZONES

(71) Applicant: Adaptive Plasma Technology Corp., Icheon-si (KR)

(72) Inventors: Woo Hyung Choi, Seongnam-si (KR); Sang Woo Lee, Suwon-si (KR)

(73) Assignee: VM INC., Icheon (KR)

( * ) Notice: Subject to any disclaimer, the term of this patent is extended or adjusted under 35 U.S.C. 154(b) by 733 days.

(21) Appl. No.: 17/551,857

(22) Filed: Dec. 15, 2021

(65) Prior Publication Data
US 2023/0187251 A1    Jun. 15, 2023

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC ........... H01L 21/6831; H01L 21/67103; H01L 21/67248; H01L 21/6833
USPC ...................................... 219/444.1
See application file for complete search history.

(56) References Cited

U.S. PATENT DOCUMENTS

| | | | |
|---|---|---|---|
| 6,220,607 B1 * | 4/2001 | Schneider | H01L 21/67103 277/933 |
| 10,707,110 B2 * | 7/2020 | Pape | H01L 21/6833 |
| 2004/0155026 A1 * | 8/2004 | Mandal | H05B 3/10 219/465.1 |
| 2011/0092072 A1 * | 4/2011 | Singh | C23C 14/50 156/345.52 |
| 2013/0220989 A1 * | 8/2013 | Pease | H01L 21/67103 219/458.1 |
| 2014/0048529 A1 * | 2/2014 | Pease | H05B 1/0202 219/494 |
| 2014/0159325 A1 * | 6/2014 | Parkhe | H01L 21/67109 156/154 |
| 2014/0268479 A1 * | 9/2014 | West | H05K 7/20 165/185 |
| 2015/0228513 A1 * | 8/2015 | Parkhe | H01L 21/6831 219/448.12 |
| 2015/0377571 A1 * | 12/2015 | Hiroki | H01J 37/32724 165/296 |
| 2016/0027678 A1 * | 1/2016 | Parkhe | H01L 21/67248 219/536 |
| 2016/0035544 A1 * | 2/2016 | Lubomirsky | H01J 37/32724 118/723 R |

(Continued)

FOREIGN PATENT DOCUMENTS

| WO | 2011049620 | 4/2011 |
|---|---|---|
| WO | 2013057949 | 4/2013 |

*Primary Examiner* — Eric S Stapleton
(74) *Attorney, Agent, or Firm* — CANTOR COLBURN LLP

(57) ABSTRACT

Provided is an electrostatic chuck with multiple heater zones. The electrostatic chuck with multiple heater zones comprises multiple micro heater zones; a switch module having each switching means connected to each micro heater zone; and a switch controlling module for controlling an operation of the switch module, wherein each micro heater zone can be heated individually by a corresponding heating element, and each partial area of a wafer secured on the electrostatic chuck is heated independently by each micro heater zone.

3 Claims, 6 Drawing Sheets

(56) References Cited

U.S. PATENT DOCUMENTS

| | | | |
|---|---|---|---|
| 2016/0205725 A1* | 7/2016 | Pease | H05B 1/0202 |
| | | | 219/448.12 |
| 2017/0148657 A1* | 5/2017 | Pape | H01L 21/67103 |
| 2017/0186592 A1* | 6/2017 | Ni | H01J 37/32532 |
| 2017/0215230 A1* | 7/2017 | Parkhe | H01L 21/67248 |
| 2018/0005857 A1* | 1/2018 | Zhang | H01J 37/321 |
| 2018/0197761 A1* | 7/2018 | Ferrara | C23C 14/56 |
| 2018/0350569 A1* | 12/2018 | Kaneko | H01L 21/3065 |
| 2018/0350570 A1* | 12/2018 | Endo | H01L 21/67248 |
| 2019/0214236 A1* | 7/2019 | Marohl | H01L 21/68757 |
| 2019/0385828 A1* | 12/2019 | Singhal | H01L 21/31122 |
| 2020/0335378 A1* | 10/2020 | Pape | H01L 21/6833 |

* cited by examiner

ELECTROSTATIC CHUCK WITH MULTIPLE HEATER ZONES

BACKGROUND OF THE INVENTION

1. Field of the Invention

The present invention relates to an electrostatic chuck with multiple heater zones, in particular relates to the electrostatic chuck with the multiple heater zones formed as plurality of heating areas divided and separated each other in order to control a heating individually.

2. Description of the Related Art

An electrostatic chuck used in an etching process among semiconductor manufacturing processes may have both one function of fixing a wafer (wafer chucking) and the other function of controlling a temperature (temperature controlling). The temperature has to be kept uniform in the course of the etching process, hence the process uniformity can be obtained to increase a process yielding rate. The temperature of the electrostatic chuck needs to be controlled for obtaining the uniformity of the electrostatic chuck (ESC) temperature. WO 2011/049620 describes a heating plate with a flat heater zone for a semiconducting process. And WO 2013/057949 describes an electrostatic chuck where the temperature is controlled within a processing chamber. The ESC temperature has to be controlled for maintaining a uniform temperature property of a wafer, and the ESC temperature may be controlled by placing a heating means in an insulating layer formed at an upper portion of the ESC. But it is difficult for the whole ESC temperature or the whole wafer temperature to be controlled by the heating means. A partial temperature difference may occur between different parts of the wafer in the course of heating by the heating means, and therefore, the partial temperature difference should be compensated. The ESC contacting the wafer needs to be divided plurality of partial areas for compensating, and then, a temperature compensation can be performed for each divided area. And also, a means for compensating the temperature should make no effect to the whole process. But the known prior arts describe no skill for such means.

PURPOSE OF THE INVENTION

An object of the present invention is to provide with an electrostatic chuck with multiple heater zones wherein a temperature of each heat zone can be controlled for regulating a whole electrostatic chuck temperature.

SUMMARY OF THE INVENTION

In one embodiment of the present invention, an electrostatic chuck with multiple heater zones comprises multiple micro heater zones; a switch module having each switching means connected to each micro heater zone; and a switch controlling module for controlling an operation of the switch module, wherein each micro heater zone can be heated individually by a corresponding heating element, and each partial area of a wafer secured on the electrostatic chuck is heated independently by each micro heater zone.

In other embodiment of the present invention, the electrostatic chuck further comprises 2 to 50 AC heater zones in a ceramic layer placed on the multiple micro heater zones, and an operation of each AC heater zone is controlled by a semiconductor switch.

In another embodiment of the present invention, the multiple micro heater zones are placed at a multiple micro zone board.

In still another embodiment of the present invention, the multiple micro zone board is placed within a heating regulation area formed in an operating body made of a metal material.

In still another embodiment of the present invention, the electrostatic chuck further comprises a temperature sensor for detecting the temperature of the AC heater zones.

In still another embodiment of the present invention, an optical communicating circuit module for delivering a controlling information for each heater zone to the multiple micro zone board, and a driving module and a power circuit module are placed on the multiple micro zone board.

In still another embodiment of the present invention, the number of multiple micro heater zones is 50 to 500.

In still another embodiment of the present invention, the operating body is made of an aluminum material.

In still another embodiment of the present invention, the electrostatic chuck further comprises a cooling line formed in the operating body.

In still another embodiment of the present invention, an inner portion of the heating regulation area is filled with a thermal paste.

DETAILED DESCRIPTION OF EXEMPLARY EMBODIMENTS

Exemplary embodiments of the present invention will be described herein below with reference to the accompanying drawings.

Figure 1:
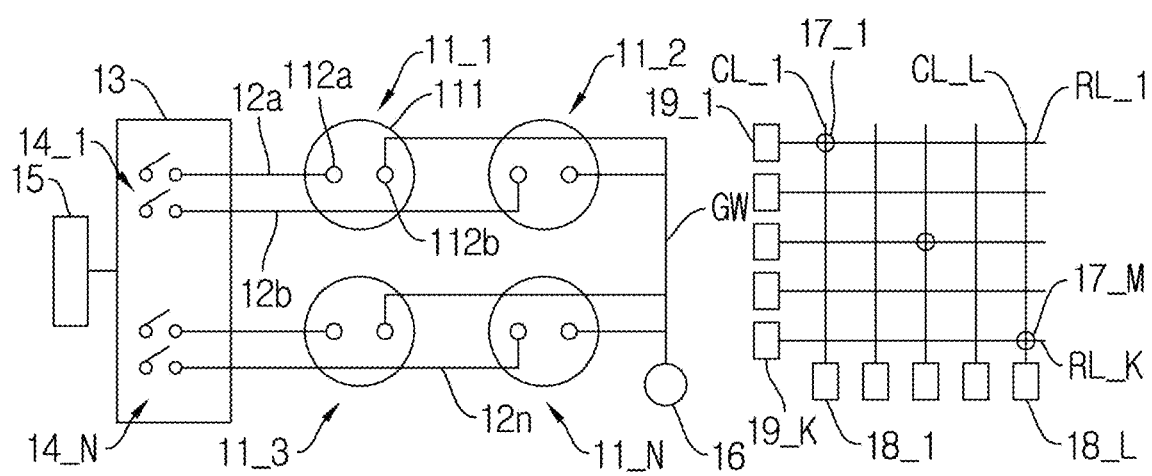
FIG. 1 shows an exemplary embodiment of multiple micro heater zones according to the present invention.

FIG. 1 shows an exemplary embodiment of multiple micro heater zones according to the present invention.

Referring to FIG. 1, an electrostatic chuck with multiple heater zones comprises multiple micro heater zones 11_1 to 11_N; a switch module 13 having each switching means 14_1 to 14_N connected to each micro heater zone 11_1 to 11_N; and a switch controlling module 15 for controlling an operation of the switch module 13, wherein each micro heater zone 11_1 to 11_N can be heated individually by a corresponding heating element, and each partial area of a wafer secured on the electrostatic chuck is heated independently by each micro heat zone.

The multiple micro heater zones 11_1 to 11_N may be formed in a part corresponding to that of a wafer to be heated. For example, the multiple micro heater zones 11_1 to 11_N may be formed within a ceramic layer placed at an upper part of the electrostatic chuck, and preferably may be formed at a heating means made independently below or at the lower part of the ceramic layer. If the multiple micro heater zones 11_1 to 11_N are placed at the lower part of the ceramic layer, the multiple micro heater zones 11_1 to 11_N can have a function to compensate a partial temperature difference occurring on heating by a heater. A predetermined portion of the wafer can be heated partially, and the multiple micro heater zones 11_1 to 11_N may be formed depending on a shape of the wafer. A whole area of the water may be divided into plurality of partial heated areas, the multiple micro heater zones 11_1 to 11_N may be formed at a position proper to heating each partial heated area. Each multiple micro heater zone 11_1 to 11_N may have a linear heating property, and for example, each multiple micro heater zone 11_1 to 11_N may heat each partial heated area linearly from 0 to 150° C. temperature range proportionate to an applied power. Each micro heater zone 11_1 to 11_N may comprise a LED element, a diode, a thermoelectric module or an electrical patterned resistor and the like. The heating elements may be heated with a power source applying an AC power, preferably 0 to 25 DCV. Each micro heater zone 11_1 to 11_N may be connected to each individual switch means 14_1 to 14_N, and a heating process may be regulated by each switch means 14_1 to 14_N. Each micro heater zone comprises a heating body 111 made of a material capable of delivering heat, and a pair of electrodes 112a, 112b formed at the heating body 111 and generating heat by applying power. The pair of electrodes 112a, 112b may be connected to the each individual switch means 14_1 to 14_N. And the power can be applied to the heating body 111 by the switch means 14_1 to 14_N for generating heat. The individual switch means 14_1 to 14_N may be comprised in a switch module 13, and the switch module 13 may store a condition of each switch means 14_1 to 14_N for maintaining a state of each switch means 14_1 to 14_N or for converting the state of each switch means 14_1 to 14_N. Each individual switch means 14_1 to 14_N can operate with an operating signal generated by the switch controlling module 15. Specifically, an ON or OFF signal may be transmitted to the switch module 13 from the switch controlling module 15, and the switch module 13 may maintain a state of each individual switch means 14_1 to 14_N or may convert a state of ON/OFF according to the signal. The number of the heater zones 11_1 to 11_N may be set arbitrarily depending on a shape of the electrostatic chuck or the wafer, and for example, may be 10 to 500, but not limited to.

Referring to an embodiment depicted in the left part of FIG. 1, one electrode 112a of each heater zone 11_1 to 11_N can be connected to the each individual switch means 14_1 to 14_N with each connecting wire 12a to 12N. And the other electrode 112b of each heater zone 11_1 to 11_N can be grounded to a ground electrode 16 with a grounding wire GW. Referring to an embodiment depicted in the right part of FIG. 1, each heating area 17_1 to 17-M may be connected to each column switch 18_1 to 18_N of a first switch group with each column wire CL_1 to CL_L of a first connecting wire group. And each heating area can be connected to each row switch 19_1 to 19_K with each row wire RL_1 to RL_K of a second connecting wire group. The column switch 18_1 to 18_L can cooperate with the row switch 19_1 to 19_K for heating each heat area 17_1 to 17_M individually. The heating area 17_1 to 17_M may have a function identical to or similar to the multiple micro heater zones 11_1 to 11_N. The individual control for each micro heater zone 11_1 to 11_N may be performed in various ways, but not limited to.

Figure 2:
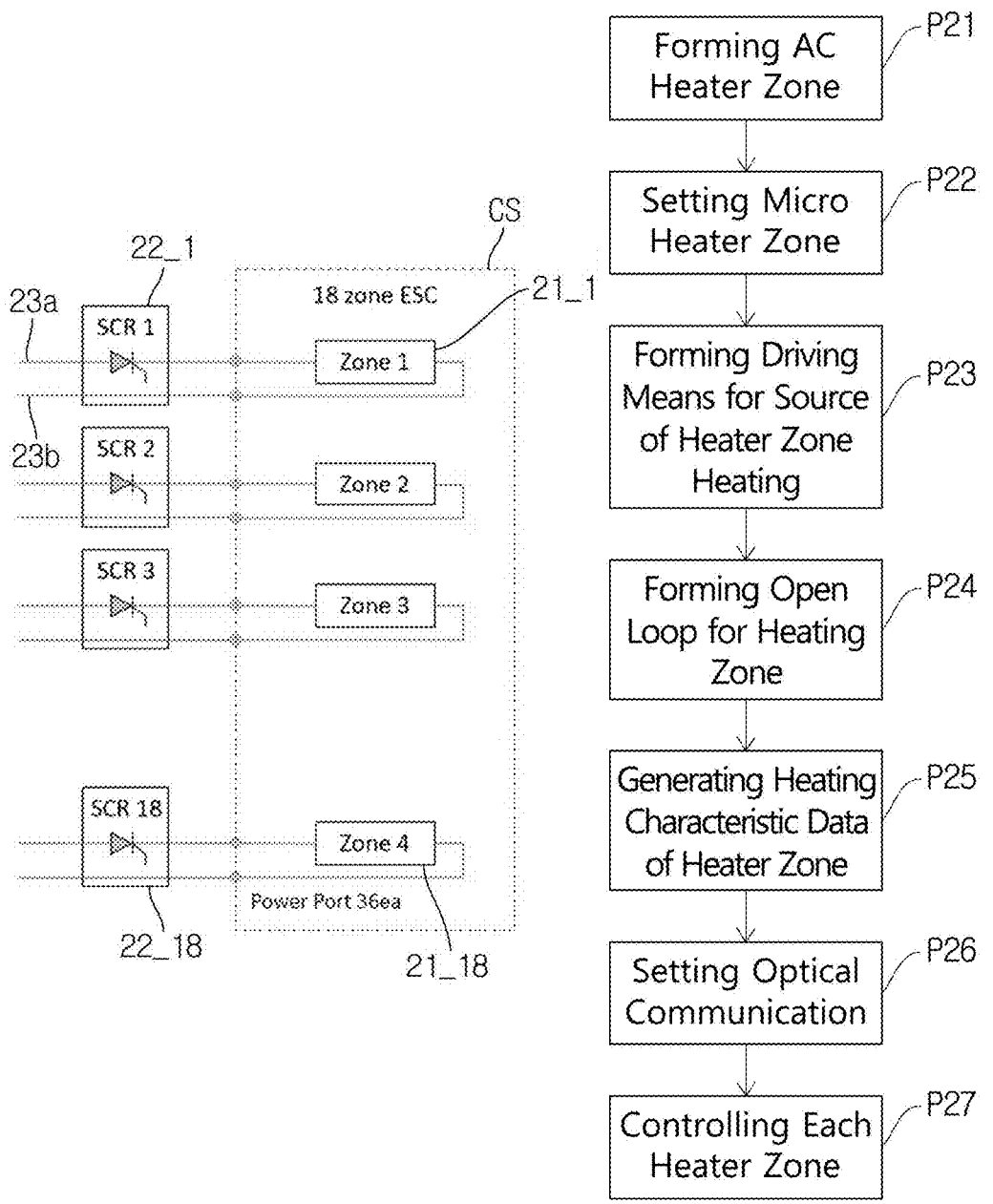
FIG. 2 shows an exemplary embodiment of AC heater zones according to the present invention.

FIG. 2 shows an exemplary embodiment of AC heater zones according to the present invention.

Referring to FIG. 2, AC heater zones 21_1 to 21_18 may be formed at an inner portion of a ceramic layer CS, and the AC heater zones 21_1 to 21_18 may correspond to the multiple micro heater zones 11_1 to 11_N described in FIG. 1. The AC heater zones 21_1 to 21_18 may be applied to a 300 mm silicon wafer, for example, and an AC power can be supplied to the AC heater zones 21-1 to 12_18. A heating element, a power terminal and a temperature sensor such as a thermocouple may be placed at the AC heater zones 21_1 to 21_18. A connecting port may be formed at each AC heater zone 21_1 to 21_18, and an operation of each AC heater zone 21_1 to 21_N may be regulated by each semiconductor individual switch 22_1 to 22_18 such as a thyristor corresponding to an individual switch means. The semiconductor individual switch 22_1 to 22_18 may be connected to the AC heater zone 21_1 to 21_18 with a connecting wire 23a, 23b, and each heater zone 21_1 to 21_18 may be connected to an AC heating power source as forming an independent heating circuit. The AC heater zones 21_1 to 21_18 may contain 18 divided areas and may be connected to each other, but the number of the AC heater zones 21_1 to 21_18 may become various, for example 2 to 50, but not limited to. Each of 18 semiconductor individual switches 22_1 to 22_18 can be connected to each of 18 AC heater zones 21_1 to 22_18 in the embodiment of FIG. 2. Each individual switch 22_1 to 22_18 may operate independently, and hence each AC heater zone 21_1 to 21_18 may be heated independently.

The multiple micro heater zone described in FIG. 1 may be at a lower part of the AC heater zones 21_1 to 21_18, and the multiple micro heater zone may operate independently to the AC heater zones 21_1 to 21_18. The number of multiple micro heater zones may be 50 to 500 depending on the shape of a wafer, but not limited to. The micro heater zones may be placed under a ceramic layer, and the micro heater zones may operate in the same way as or similar to the AC heater zones 21_1 to 21_18. And the micro heater zones may compensate a partial temperature difference of the electrostatic chuck or the wafer heated by the AC heater zones 21_1 to 21_18. Firstly, the electrostatic chuck or the wafer may be heated by the AC heater zones 21_1 to 21_18 or other heating means, and then secondly, the micro heater zones may make temperature compensation on the electrostatic chuck or the wafer.

Referring to the right part of FIG. 2, a method for regulating a heating process of the electrostatic chuck may comprise forming the AC heater zones 21_1 to 21_18 in an insulating layer or the ceramic layer P21; forming the micro heater zones under the ceramic layer P22; installing a driving means for driving the AC heater zones 21_1 to 21_18 and the micro heater zones P23; forming an open circuit or an independent circuit to connect AC heater zones 21_1 to 21_18 and the micro heater zones to individual heating switches and semiconductor individual switches, respectively P24; setting a communicating means such as an optical communication between a controlling means for controlling an operation and a switch controlling module or a condition detecting module for communicating data P26; and controlling each AC heater zone 21_1 to 21_18 or each micro heater zone individually P27. The AC heater zones 21_1 to 21_18 or the micro heater zones may be formed according to the whole area of the wafer in the cores of process, and different heater zones may have an identical to a size or shape or different sizes or shapes each other. When the heater zones are formed P21, P22, a heating source for heating each heater zone may be placed and the driving means for driving the heating source may be placed P23. The heating source may be various electric element or article such as a LED element, a diode, a thermoelectric element, a patterned resist element or the like that generates heat by supplying electrical power, and each heater zone may be heated when the switch operates by the driving means. The switch may be operated by the switch controlling module, and the switch controlling module may be operated by the controlling module installed in an outside of a processing chamber. The switch may become a semiconductor switch such as a silicon controlled rectifier, as shown in FIG. 2, but not limited to. Each switch may have an open loop structure or an independent circuit structure P24, and each switch may operate independently on receiving an operating signal. Different heater zones may have different shapes each other, and may be formed at different locations. Hence each heater zone may generate each heating characteristic data according to each shape and each location P25. Each switch for operating each heater zone has to be operated in a process, and a bias RF power may be applied to the electrostatic chuck in the course of the process. A bias noise may be generated because of applying the bios RF power, therefore a communicating way not affected by the noise has to be made. And the optical communication such as an optical fiber communication may be set P26. The operating signal may be transmitted to the switch controlling module via the optical communication for controlling the switch operation. The switch operation may be performed in various ways not limited to.

Figure 3:
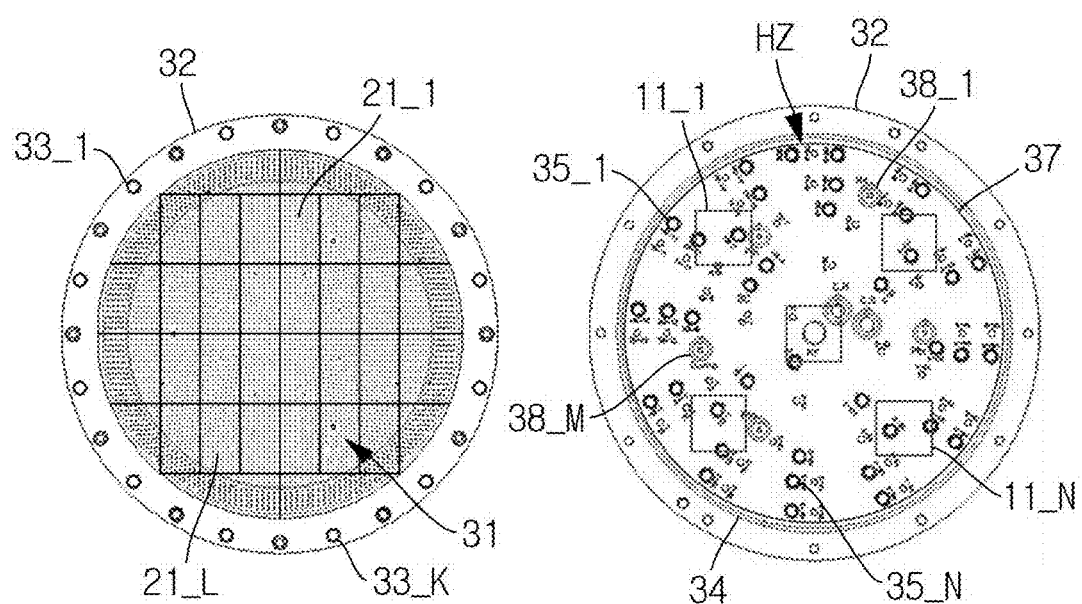
FIG. 3 shows an exemplary embodiment of a top and bottom view of an electrostatic chuck according to the present invention.

FIG. 3 shows an exemplary embodiment of a top and bottom view of an electrostatic chuck according to the present invention.

Referring to FIG. 3, an inner part of the ceramic layer placed at an area where the wafer is fixed may be divided in a form of 2 dimensional matrix, and each divided area may be an area where each AC heater zone 21_1 to 21_L is formed. The whole area where the wafer is fixed may correspond to the AC heater zones 21_1 to 21_L. A plurality of coupling holes 31_1 to 33_K may be formed along a peripheral part of the area where the wafer is fixed, and the AC heater zones 21_1 to 21_L may be formed at the area where the wafer is fixed. Referring to the right part of FIG. 3, at least a pin hole where a lift pin is coupled or a plurality of guiding holes 38_1 to 38_M for flowing a gas may be formed at a body 31 of the electrostatic chuck, and a plurality of connecting holes 35_1 to 35_N for connecting electrically each AC heater zones 21_1 to 21_N and a power supplying means or a controlling means may be formed. An electrical power may be supplied to a heating element placed at each AC heater zone 21_1 to 21_L through a wire extending along the connecting holes 35_1 to 35_N, or information about each heater zone 21_1 to 21_L may be obtained through a communicating cable. An operation body 34 for supplying power or obtaining information may be formed under the ceramic layer, and a micro zone board 37 may be placed at the operating body 34. And the micro heater zone 11_1 to 11_N may be placed at an inner surface of the micro zone board 37. Both the micro heater zones 11_1 to 11_N and the AC heater zones 21_1 to 21_L may be formed within the operating body 34.

Figure 4:
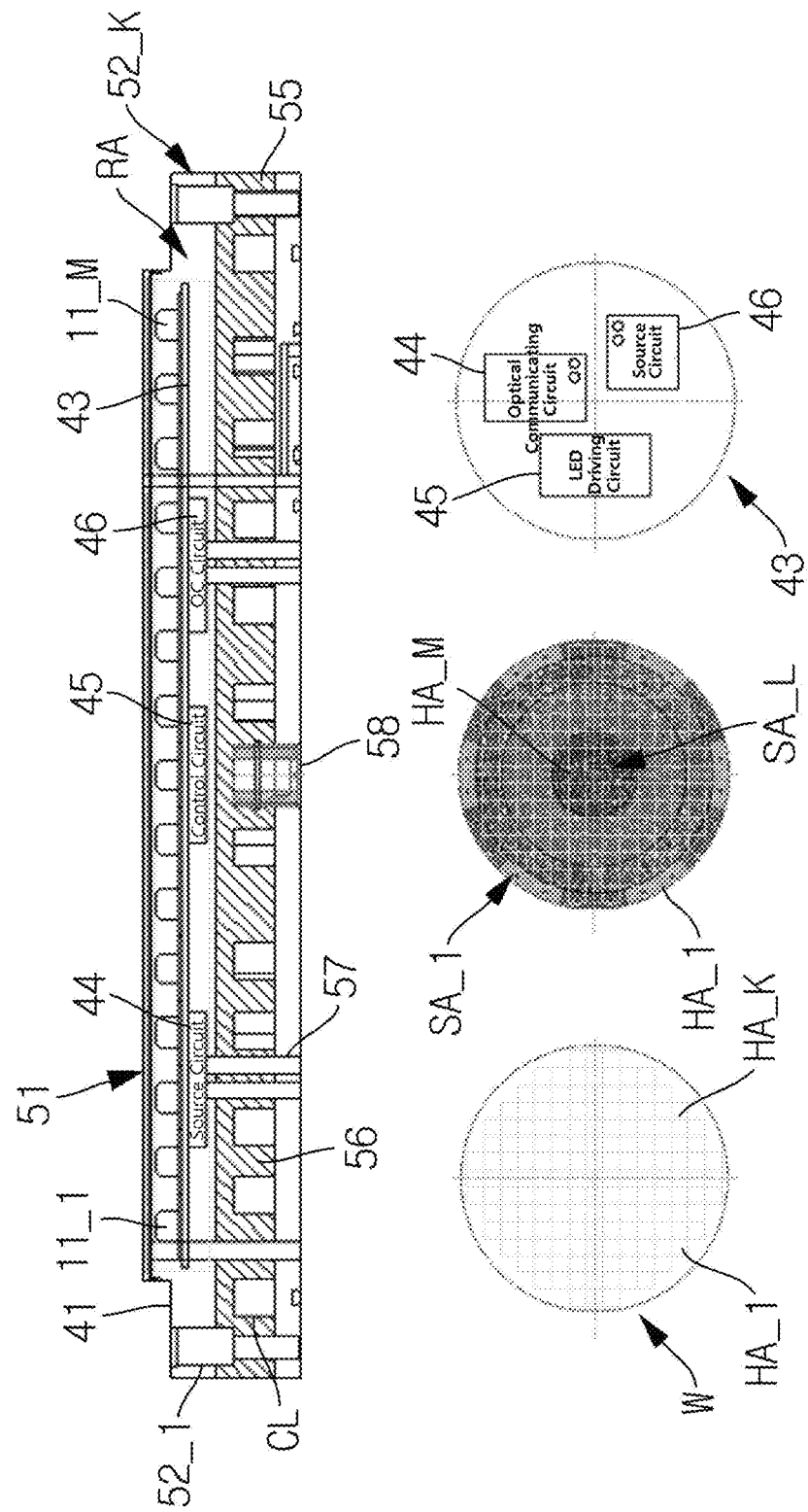
FIG. 4 shows an exemplary embodiment of an electrostatic chuck with multiple heater zones according to the present invention.

FIG. 4 shows an exemplary embodiment of an electrostatic chuck with multiple heater zones according to the present invention.

Referring to FIG. 4, micro heater zones 11_1 to 11_N may be placed at the micro zone board 43. And also the zone board 43 may be placed within a heating regulating area RA formed at an operating body 41. The AC heater zones 21_1 to 21_L may be placed within the ceramic layer 42 formed at an upper surface of the operating body 41 made of a metal material. An upper part of the operating body 41 may be formed the upper part of the operating part 41, the zone board 43 may be placed within the heating regulating area RA. And the micro heater zones 11_1 to 11_N may be at the zone board 43. The operating body 41 may be a cylindrical shape on the whole and may be made of a metal material, for example an aluminum. A cooling line CL may be formed at a lower part of the operating body 41, and the heating regulating area RA may be formed at the upper part of the operating body 41. The zone board 43 may be placed at the heating regulating area RA, and the zone board 43 may become an electric board such as a printed circuit board. A plurality of heater zones 11_1 to 11_N may be placed on the zone board 43 with separated each other, and a LED element, a diode or a thermocouple element may be placed at each micro heater zone 11_1 to 11_N. The individual switch means described above may be connected to the each heater zone 11_1 to 11_N.

The heating regulating area RA may protrude upward by a separating wall 411 and may comprise a grooving part recessed to an inner part of the operating body 41. The zone board 43 may be located separated from a bottom surface of the heating regulating area RA, the optical communicating circuit module 44 may be placed at a lower surface of the zone board 43, and the optical communicating circuit module 44 may be connected to the controlling module 441 such as a programmable machine controller computer. A guiding tube CP1, CP2 may be inserted and fixed at the guiding hole that extends from the inner part of the heating regulating area RA to the outer part of the operating body 41. The optical circuit module 44 may be connected for communicating data by a connecting wire CA1, CA2 that is guided to the inner part of the heating regulating area RA through the guiding tube CP1, CP2. The driving module 45 may be placed under the zone board 43, and the driving module 45 may be connected to the optical communicating circuit module 44 or the power source circuit module 46 for communicating signal or data. The power source circuit module 46 placed under the zone board 43 may supply electrical power to the micro heater zones 11_1 to 11_N. The power source circuit module 46 can be connected to an outside electrical power source, and can supply 24 VDC power to each micro heater zone 11_1 to 11_N on receiving an operating signal from the driving module 45. The connecting tubes CP3, CP4 may be inserted and fixed in the operating body 41, and cables can extend into the heating regulating area RA with the connecting tubes CP3, CP4. The power source circuit module 46 may be connected to the outside power supplying means 461 electrically by the cables, and for example, 5 to 24 VDC power can be supplied by the outside power supplying means 461.

An electrical insulating material may be filled within the heating regulating area RA, for example a thermal paste with a thermal conductivity can be filled. A heat generated in the course of operating the zone board 43, the optical communicating circuit module 44, the driving module 45 and the power source circuit module 45 may be transmitted to the operating body 41 through the thermal paste layer, and the operating body 41 may be cooled by a coolant flowing in the cooling line CL. A cover may be coupled to the upper part of the heating regulating area RA for enclosing, and the cover may be coupled in a permanent bonding way such as welding or soldering, or in a removable way. A plurality of through holes may be formed at the cover for connecting an outside operating means.

The ceramic layer 42 may be placed on the upper surface of the heating regulating area RA. And a DC layer 421 may be formed on the ceramic layer 42 for securing the wafer and the DC layer 421 may be connected to the chucking power supplying source 49 for applying 500 to 3,000 VDC voltage. The DC layer 421 may become a mono polar or bipolar structure. A temperature sensor may be placed at the AC heater zones 21_1 to 21_L that is located on the ceramic layer 42, and for example, the temperature sensor may be an optical detecting sensor such as an Infrared thermocouple. At least one temperature may be installed within the ceramic layer 42, preferably may be installed at each AC heater zone 21_1 to 21_L. An AC heating controller 47 and an AC power source 48 may be connected to each AC heater zone 21_1 to 21_N, and an AC power can be supplied to the AC heater zone 21_1 to 21_L based on an information transmitted from the temperature sensor.

And as describe above, each AC heater zone 21_1 to 21_L may be heated in an independent way. The temperature and the temperature uniformity degree of the ceramic layer or the electrostatic chuck may be determined by the controlling module 441 such as a computer, and then the AC heater zones 21_1 to 21_L may be heated according to the temperature or the uniformity degree. The temperature of the wafer or the electrostatic chuck may be detected by the temperature sensor in the course of a process, and the detected information can be transmitted to the controlling module 441 or the AC heating controller 47. If a partial temperature difference in the wafer or the electrostatic chuck is detected in the course of the process, then the micro heater zone 11_1 to 11_N may be heated for compensating. A power value applied to the micro heater zone 11_1 to 11_N may be transmitted to the optical communicating circuit module 44 in an optical communicating way according to a controlling algorism. The optical communicating circuit module 44 can convert the received signal into an electric signal to transmit to the driving module 45. The driving module 45 can control the operation of the individual switch means according to the electric signal for regulating a power applied to each heater zone 11_1 to 11_N. Thus, the partial temperature difference can be removed by regulating the temperature of each micro heater zone 11_1 to 11_N.

The whole temperature of the electrostatic chuck may be determined by the controlling module 441 to be transmitted to the AC heating controller 47, and the AC heating controller 47 may control the AC heater zone 21_1 to 21_L by regulating the AC power source 48. According to one embodiment of present invention, the temperature of the electrostatic chuck may be regulated on the whole by the AC heater zones 21_1 to 21_L, and the partial temperature difference between different partial areas occurring in the course of heating may be compensated by the micro heater zones 11_1 to 11_N. Specifically, the whole temperature and the whole uniformity of the electrostatic may be determined by the controlling module 441, and the power value may be transmitted to the zone board 43 by the optical communicating module 44 in the optical communication according to the controlling algorism. The optical communicating circuit may be installed at the zone board 43 for converting the controlling signal into the electric signal. And the electric signal can be transmitted to the driving module for heating the micro heater zones 11_1 to 11_N by operating the power source circuit module 46. The whole temperature of the electrostatic chuck may be determined by the controlling module 441 to be transmitted to the AC heating controller 47, the AC heating controller 47 may transmit the controlling signal to the AC power source 48 according to a PID controlling algorism, and the AC heater zones 21_1 to 21_L, for example divided into 4 to 38 areas, may be heated. The feedback temperature sensor such as an optical thermocouple may be installed each AC heater zone 21_1 to 21_L for transmitting the temperature of each AC heater zone 21_1 to 21_L to the AC heating controller 47. In the course of heating the electrostatic chuck by the AC heater zones 21_1 to 21_L, and the partial temperature difference may occur in the electrostatic chuck. And the temperature difference can be compensated by the micro heater zones 11_1 to 11_N, hence the temperature uniformity may be achieved all over the whole wafer. A bias RF power may be supplied to the electrostatic chuck by a RF power module RF in the course of etching process in a semiconductor manufacturing. The electrostatic chuck according to present invention may be free to an interference according to the bias RF power in the course of controlling the heating process or the temperature regulation of each heater zone 11_1 to 11_N.

Figure 5:
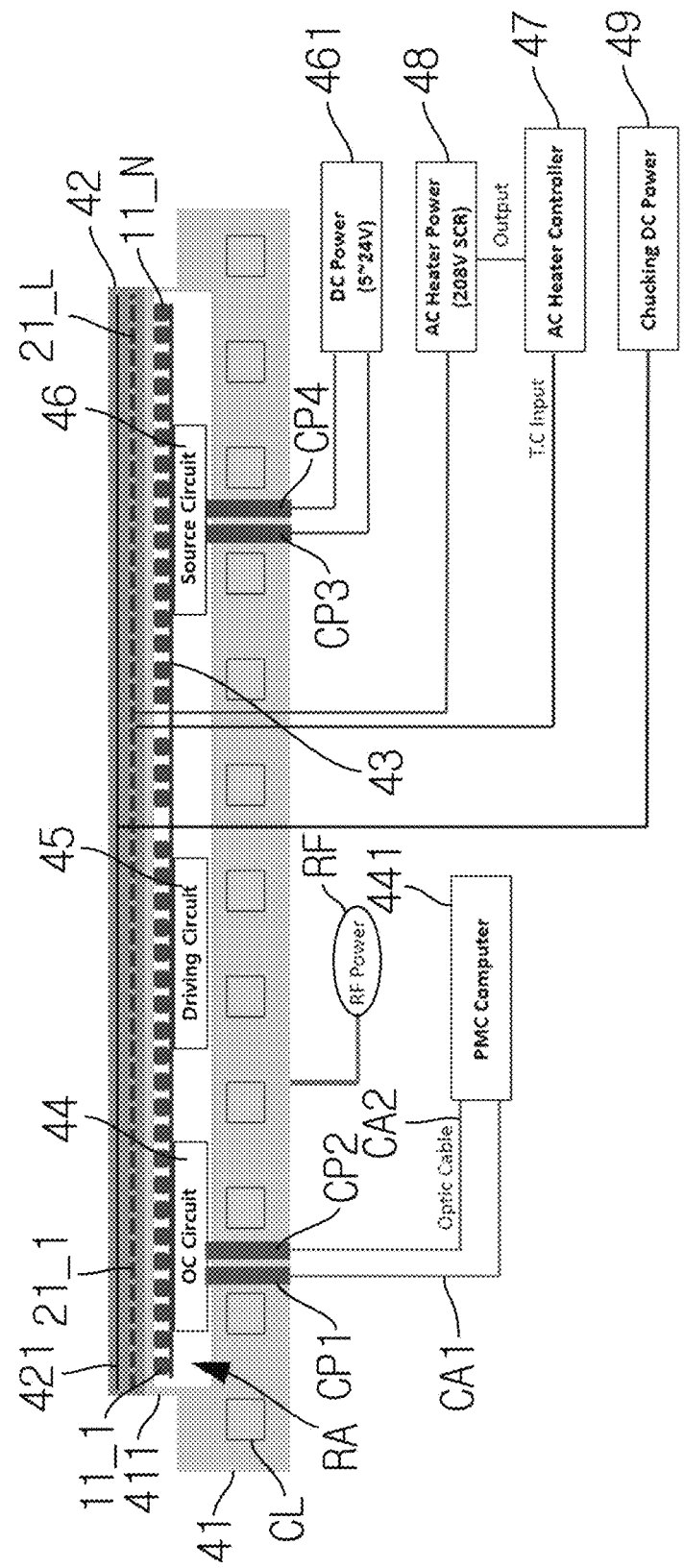
FIG. 5 shows an exemplary embodiment of a sectional view of the electrostatic chuck according to the present invention.

FIG. 5 shows an exemplary embodiment of a sectional view of the electrostatic chuck according to the present invention.

Referring to FIG. 5, a cooling area 56 with a plurality of cooling lines CL of a single line or dual lines structure may be formed in the lower part of the operating body 41, and a heating area 51 for regulating the temperature of the wafer may be formed on the upper part of the heating regulating area RA. The multiple micro zone board 43 may be within a regulating area RA. A plurality of coupling holes 52_1 to 52_K may be formed at a peripheral area 55 of the operating body 41 with a cylindrical shape, and a plurality of guide pipes 57 for connecting an inside part and an outside part of the regulating area RA may be formed at the operating body 41. A RF electrode 58 for applying a RF power may be formed at a center of the operating body 41. A plurality of heating areas HA_1 to HA_K set at the wafer may be heated partially or wholly by the micro heater zones 11_1 to 11_M or the AC heater zones for obtaining the temperature uniformity. As shown in the lower part of FIG. 5, The heating areas of the wafer may have a two dimensional matrix structure. And also, the heating areas of the wafer may have shapes of circular strips SA_1 to SAL that extend along a circumferential direction, and each circular strip SA_1 to SAL may be divided into at least one area. The shape of the micro heater zones 11_1 to 11_M or the AC heater zones may become various according the structure of the wafer, but not limited to. As shown in the lower part of FIG. 5, the optical communicating circuit module 44, the driving module 45 or the source circuit module 46 may be placed at suitable part of the zone board 43, and furthermore, additional means for controlling the heating or an information detection may be placed at the zone board 43, but not limit to.

Figure 6:
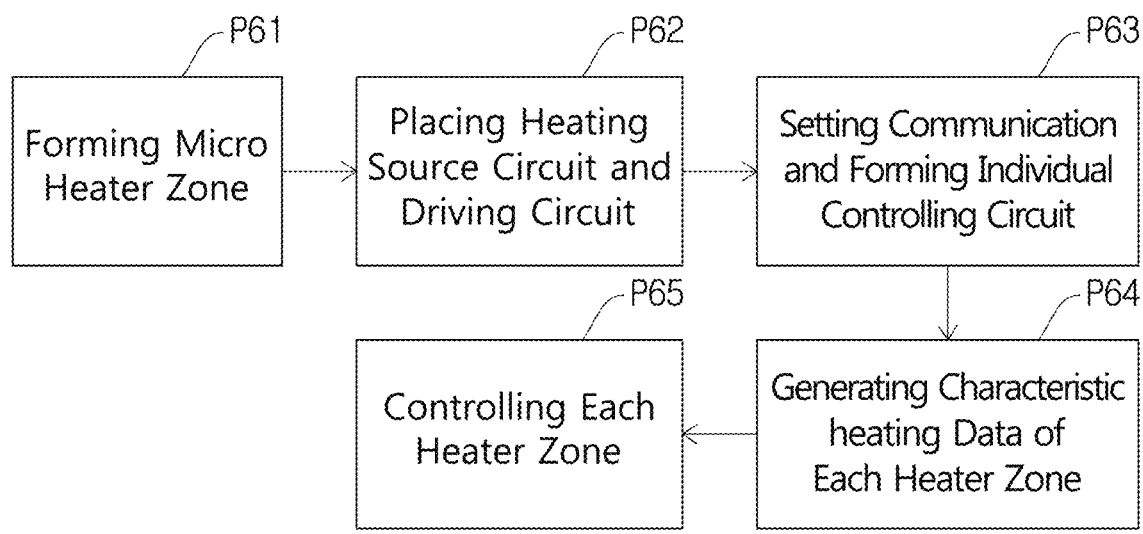
FIG. 6 shows an operating method of the multiple micro heater zones according to the present invention.

FIG. 6 shows an operating method of the multiple micro heater zones according to the present invention.

Referring to FIG. 6, a method for operating the micro heater zone comprises forming a plurality of multiple micro heater zones P61; placing a heating source for heating the plurality of micro heater zones and a driving circuit for operating each heater zone P62; setting an optical communicating circuit for detecting the operation and condition of each heater zone, and forming each individual controlling circuit for operating a heating element placed at each heater zone P63; generating a temperature characteristic data of each heater zone P64; and controlling a condition of each heater zone by a controlling module.

The micro heater zones may be formed at the regulating area formed at the operating body, for example made of an aluminum material P61. The heating source and the driving circuit may be placed at the zone board installed at the regulating area P62, and the optical communicating circuit for setting communication may be installed at the zone board P63. Each heater zone can be heated by a LED element, a diode, a thermocouple element or a resist wire pattern, and the temperature characteristic data according to the power supply may be generated P64. For example, the temperature of the heater zones may be linearly proportional to the amount of the supplied power, but not limited to. The heating condition of each heater zone may be controlled by regulating open-close of the individual switch means P65, but not limited to.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. An electrostatic chuck with multiple heater zones, the electrostatic chuck comprising:
    multiple heater zones formed within a ceramic layer, wherein each of the multiple heater zones is configured to be heated individually by a corresponding heating element, and each of the multiple heater zones is configured to heat independently each corresponding partial area of a wafer secured on the electrostatic chuck;
    a switch module having each switching means connected to each of the heater zones;
    a switch controlling module for controlling an operation of the switch module;
    multiple AC heater zones formed above the multiple heater zones within the ceramic layer and operating independently from the multiple heater zones, wherein the multiple AC heater zones are coupled to an AC power source and correspond to the multiple heater zone, respectively;
    multiple semiconductor switches coupled to the multiple AC heater zones, respectively, and configured to heat the multiple AC heater zones individually and independently, wherein the multiple AC zones, the multiple semiconductor switches and the AC power source form multiple heating circuits operating individually and independently;
    an operating body formed under the ceramic layer and made of an aluminum;
    a cooling line formed within the operating body;
    a heating regulation area formed between the operating body and the ceramic layer and filled with a thermal paste;
    a zone board formed within the heating regulation area and spaced apart from a bottom of the heating regulation area, wherein the ceramic layer is disposed on the zone board; and
    an optical communicating circuit module configured to deliver controlling information to a driving module and a power circuit module disposed on a lower surface of the zone board,
    wherein the multiple AC heater zone is configured to heat the wafer and the multiple heater zone is configured to perform a temperature compensation on the heated wafer.

2. The electrostatic chuck according to claim 1, further comprising: a temperature sensor for detecting a temperature of the multiple AC heater zones.

3. The electrostatic chuck according to claim 1, wherein the number of multiple heater zones is 50 to 500.

* * * * *